US010128180B2

(12) United States Patent
Bauer et al.

(10) Patent No.: US 10,128,180 B2
(45) Date of Patent: Nov. 13, 2018

(54) CHIP PACKAGES, CHIP ARRANGEMENTS, A CIRCUIT BOARD, AND METHODS FOR MANUFACTURING CHIP PACKAGES

(71) Applicant: Infineon Technologies AG, Neubiberg (DE)

(72) Inventors: Michael Bauer, Nittendorf (DE); Alfred Haimerl, Sinzing (DE); Angela Kessler, Sinzing (DE); Wolfgang Schober, Amberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/821,879

(22) Filed: Nov. 24, 2017

(65) Prior Publication Data
US 2018/0096924 A1    Apr. 5, 2018

Related U.S. Application Data

(62) Division of application No. 14/569,958, filed on Dec. 15, 2014, now Pat. No. 9,859,198, which is a division
(Continued)

(51) Int. Cl.
*H01L 23/498* (2006.01)
*H01L 23/13* (2006.01)
(Continued)

(52) U.S. Cl.
CPC ........ *H01L 23/49838* (2013.01); *H01L 21/56* (2013.01); *H01L 23/12* (2013.01);
(Continued)

(58) Field of Classification Search
CPC ..... H01L 23/04; H01L 23/041; H01L 23/053; H01L 23/055; H01L 23/12; H01L 23/13; H01L 23/14; H01L 23/145; H01L 23/147; H01L 23/28; H01L 23/31; H01L 23/3107; H01L 23/3114; H01L 23/3121; H01L 23/3128; H01L 23/315; H01L 23/3157; H01L 23/3171; H01L 23/3185; H01L 23/3192; H01L 23/482; H01L 23/4824; H01L 23/485; H01L 23/498; H01L 23/49811; H01L 23/49816; H01L 23/49827; H01L 23/49838

See application file for complete search history.

(56) References Cited

U.S. PATENT DOCUMENTS

| 8,293,584 B2 * | 10/2012 | Guillermo | ........... H01L 21/6836 |
| | | | 257/684 |
| 9,466,545 B1 * | 10/2016 | Scanlan | ............... H05K 1/0216 |
| 2009/0072413 A1 * | 3/2009 | Mahler | ............... H01L 21/6835 |
| | | | 257/777 |

* cited by examiner

*Primary Examiner* — Eduardo A Rodela

(74) *Attorney, Agent, or Firm* — Viering, Jentschura & Partner MBB

(57) ABSTRACT

A chip package is provided, the chip package including: a chip carrier; a chip disposed over and electrically connected to a chip carrier top side; an electrically insulating material disposed over and at least partially surrounding the chip; one or more electrically conductive contact regions formed over the electrically insulating material and in electrical connection with the chip; a further electrically insulating material disposed over a chip carrier bottom side; wherein an electrically conductive contact region on the chip carrier bottom side is released from the further electrically insulating material.

13 Claims, 9 Drawing Sheets

Related U.S. Application Data of application No. 13/534,001, filed on Jun. 27, 2012, now abandoned.

(51) Int. Cl.
  *H01L 23/12* (2006.01)
  *H01L 23/31* (2006.01)
  *H01L 23/492* (2006.01)
  *H01L 21/56* (2006.01)
  *H01L 23/495* (2006.01)
  *H01L 23/00* (2006.01)

(52) U.S. Cl.
  CPC .......... *H01L 23/13* (2013.01); *H01L 23/3157* (2013.01); *H01L 23/3171* (2013.01); *H01L 23/492* (2013.01); *H01L 23/49805* (2013.01); *H01L 23/49833* (2013.01); *H01L 24/14* (2013.01); *H01L 24/17* (2013.01); *H01L 24/20* (2013.01); *H01L 24/73* (2013.01); *H01L 24/81* (2013.01); *H01L 24/92* (2013.01); *H01L 23/3121* (2013.01); *H01L 23/49562* (2013.01); *H01L 24/13* (2013.01); *H01L 24/19* (2013.01); *H01L 24/29* (2013.01); *H01L 24/32* (2013.01); *H01L 2224/0401* (2013.01); *H01L 2224/05548* (2013.01); *H01L 2224/05552* (2013.01); *H01L 2224/05572* (2013.01); *H01L 2224/12105* (2013.01); *H01L 2224/131* (2013.01); *H01L 2224/13022* (2013.01); *H01L 2224/13024* (2013.01); *H01L 2224/1403* (2013.01); *H01L 2224/14051* (2013.01); *H01L 2224/19* (2013.01); *H01L 2224/20* (2013.01); *H01L 2224/291* (2013.01); *H01L 2224/293* (2013.01); *H01L 2224/2929* (2013.01); *H01L 2224/32245* (2013.01); *H01L 2224/73253* (2013.01); *H01L 2224/73267* (2013.01); *H01L 2224/92144* (2013.01); *H01L 2924/00014* (2013.01); *H01L 2924/12032* (2013.01); *H01L 2924/1301* (2013.01); *H01L 2924/1305* (2013.01); *H01L 2924/1306* (2013.01); *H01L 2924/13034* (2013.01); *H01L 2924/13091* (2013.01)

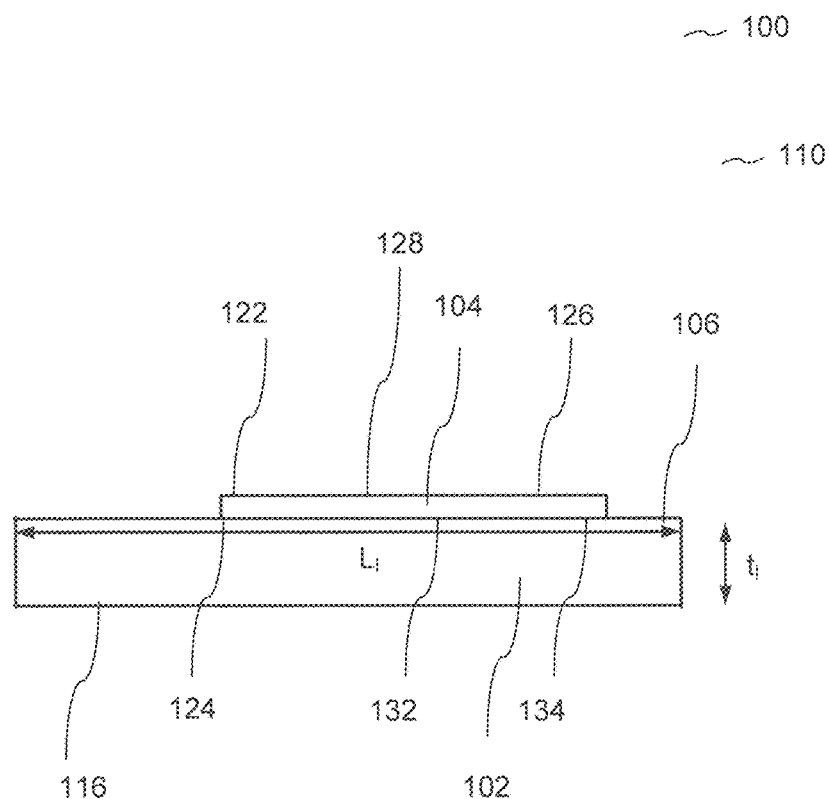
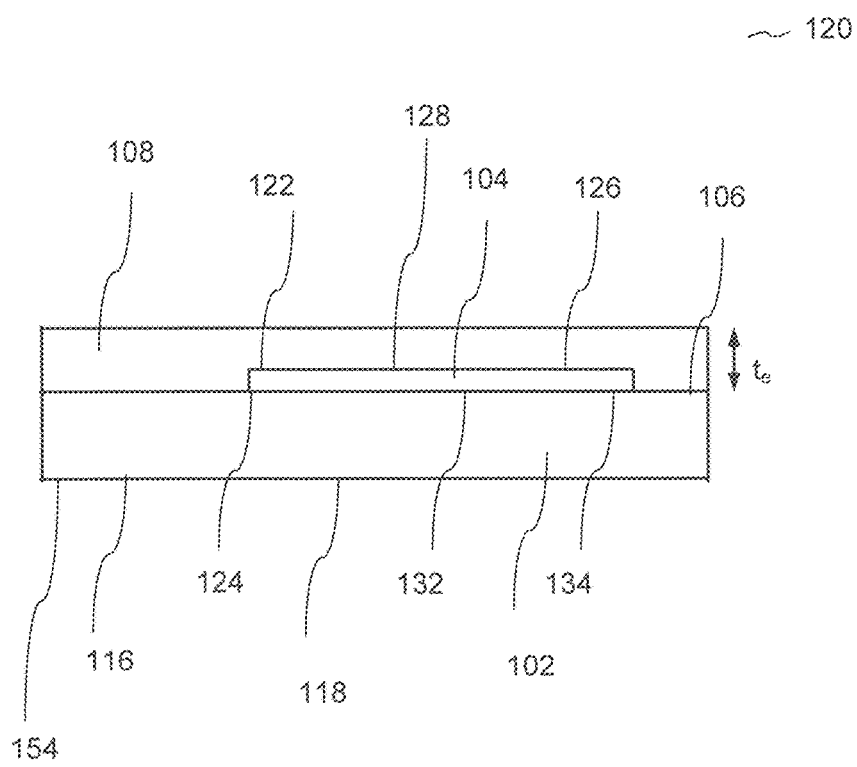

FIG 5    ~ 500

- disposing a chip over a chip carrier top side and electrically connecting the chip to the chip carrier top side; ~ 510

- disposing an electrically insulating material over the chip wherein the electrically insulating material at least partially surrounds the chip; ~ 520

- forming one or more electrically conductive contact regions over the electrically insulating material wherein the one or more electrically conductive contact regions is electrically connected with the chip; ~ 530

- disposing a further electrically insulating material over a chip carrier bottom side; ~ 540

- and releasing an electrically conductive contact region on the chip carrier bottom side from the further electrically insulating material. ~ 550

CHIP PACKAGES, CHIP ARRANGEMENTS, A CIRCUIT BOARD, AND METHODS FOR MANUFACTURING CHIP PACKAGES

CROSS-REFERENCE TO RELATED APPLICATION

This application is a divisional of U.S. patent application Ser. No. 14/569,958, filed on Dec. 15, 2014, which is a divisional application of U.S. patent application Ser. No. 13/534,001, filed Jun. 27, 2012; the contents of both applications are herein incorporated by reference in their entirety.

TECHNICAL FIELD

Various embodiments relate generally to chip packages, chip arrangements, a circuit board, and methods for manufacturing chip packages.

BACKGROUND

Until now, embedded power semiconductors exist only as surface mount device housing packages. These packages have a relatively high spatial demand, e.g. when placed on a circuit board, such as a printed circuit board. Furthermore, semiconductors with vertical current flow, e.g. power semiconductors which conduct current between a back side and a front side of the device, may require that the back side potential of the chip within the housing be redirected from the back side to the front side, i.e. to the opposite side of the semiconductor and/or the semiconductor package. For example, a back side electrical contact of the device may be redirected to the front side of the device, wherein the redirected front side contact may be placed neighboring and/or adjacent another front side contact. With high voltage components, e.g. power semiconductors, more space may be required between the contacts to maintain the creepage distance between the contacts.

SUMMARY

Various embodiments provide a chip package including: a chip carrier; a chip disposed over and electrically connected to a chip carrier top side; an electrically insulating material disposed over and at least partially surrounding the chip; one or more electrically conductive contact regions formed over the electrically insulating material and in electrical connection with the chip; a further electrically insulating material disposed over a chip carrier bottom side; wherein an electrically conductive contact region on the chip carrier bottom side is released from the further electrically insulating material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A to 1E show a method for manufacturing a chip package according to an embodiment;

FIG. 1E shows a chip package according to an embodiment; embodiment;

DESCRIPTION

Figure 1C:
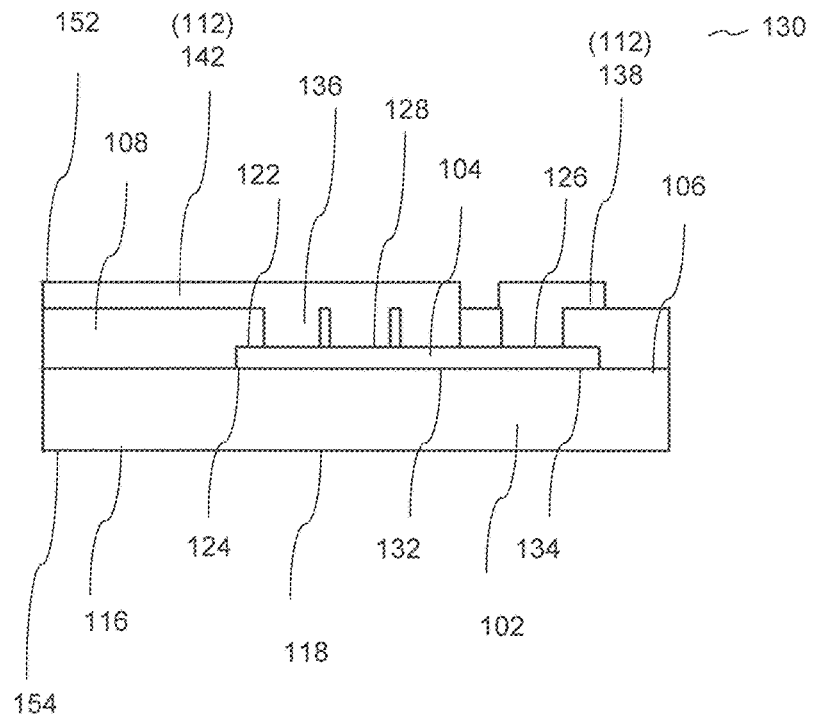
Figure 1D:
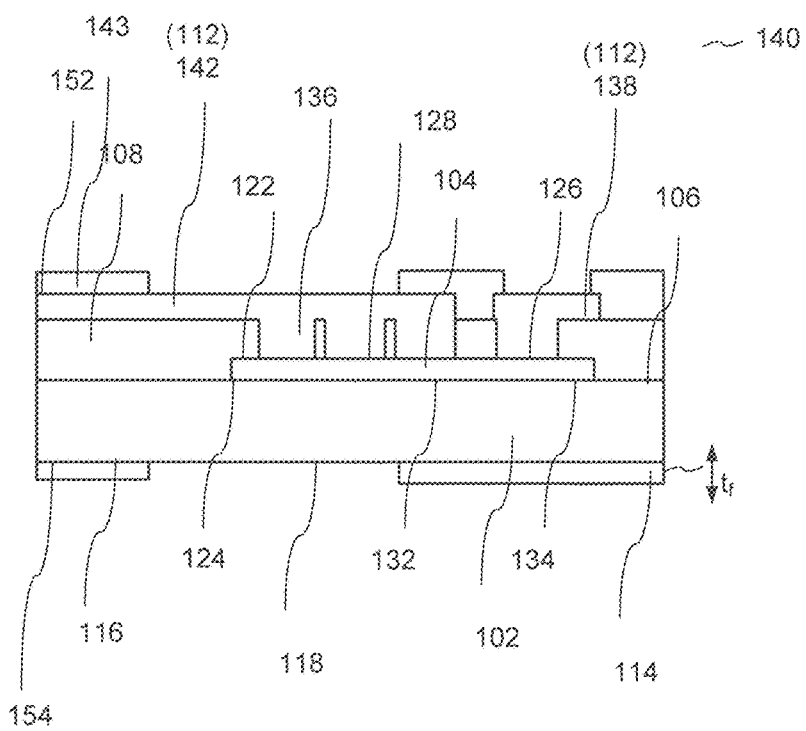

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide an embedded power semiconductor device housing which may be arranged according to a through-hole arrangement, wherein the chip package housing may be stacked at least partially and/or fully through a circuit board.

FIGS. 1A to 1E show method 100 for manufacturing a chip package according to an embodiment. Method 100 may include:

disposing chip 104 over a chip carrier top side 106 and electrically connecting chip 104 to chip carrier top side 106 (in 110);

disposing electrically insulating material 108 over chip 104 wherein electrically insulating material 108 at least partially surrounds chip 104 (in 120);

forming one or more electrically conductive contact regions 112 over electrically insulating material 108 wherein one or more electrically conductive contact regions 112 is electrically connected with chip 104 (in 130);

disposing further electrically insulating material 114 over chip carrier bottom side 116 (in 140); and releasing an electrically conductive contact region 118 on chip carrier bottom side 116 from further electrically insulating material 114 (in 150).

Chip 104 may include a semiconductor chip, e.g. a semiconductor die. The semiconductor chip may include one or more electronic components, e.g. electronic circuits, formed in a wafer substrate. The wafer substrate may include various materials, e.g. semiconductor materials. The wafer substrate may include at least one from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator SOI wafer. According to an embodiment, the wafer substrate may include a semiconductor compound material, e.g. gallium arsenide (GaAs), indium phosphide (InP). According to an embodiment, the wafer substrate may include a quaternary semiconductor compound material, e.g. indium gallium arsenide (InGaAs).

Chip 104 may be configured as a power semiconductor chip. Chip 104 may include a power semiconductor device, wherein the power semiconductor device may be capable of carrying a voltage ranging from about 5 V to about 1200 V, e.g. about 200 V to about 800 V, e.g. about 400 V to about 600V. According to an embodiment, chip 104 may be configured to carry a voltage ranging from about 5 V to about 1200 V.

Chip 104 may include a power semiconductor chip, wherein the power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device, a multi-chip device.

As shown in 110, chip 104 may include chip top side 122 and chip bottom side 124, wherein chip top side 122 may face a direction opposite to the direction which chip bottom side 124 faces.

Chip 104 may include a power transistor. Top side may also be referred to as a "first side", "front side" or "upper side" of the chip. The terms "top side", "first side", "front side" or "upper side" may be used interchangeably hereinafter. Bottom side may also be referred to as "second side" or "back side" of the chip. The terms "second side", "back side", or "bottom side" may be used interchangeably hereinafter. As used herein with respect to semiconductor power devices, the terms "top side", "first side", "front side" or "upper side" may be understood to refer to the side of the chip wherein a gate region and at least one first source/drain region may be formed. The terms "second side", "back side", or "bottom side" may be understood to refer to the side of the chip wherein a second source/drain region may be formed. Therefore, a semiconductor power transistor may support a vertical current flow through the chip between a first source/drain region 128 over top side 122 and a second source/drain region 132 over bottom side 124.

In order for chip 104 to be packaged in a housing, the following processes may be carried out.

Chip 104 may be electrically conductively bonded onto metal chip-carrier 102. As chip 104 may include a power device, an electrically conductive connection to chip back side 124 may be needed.

Chip 104 may be electrically connected to chip carrier 102. For example, chip back side 124 may be electrically bonded, e.g. electrically adhered to by means of an adhesive medium 134 to electrically conductive chip carrier 102

Chip carrier 102 may include a lead frame carrier. Chip carrier 102 may have a thickness $t_1$ ranging from about 50 µm to about 1500 µm, e.g. about 100 µm to about 500 µm, e.g. about 150 µm to about 300 µm. The lead frame may have a length $L_1$ ranging from about 1 mm to 50 mm, e.g. about 2 mm to about 20 mm, and a breadth from about 1 mm to 50 mm, e.g. about 2 mm to about 20 mm.

Chip carrier 102 may include an electrically conductive material. Chip carrier 102 may include at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy. Chip carrier 102 may include at least one from the following group of materials, the group of materials consisting of: NiPdAu, NiAu, NiPd, NiAuAg, NiPdAuAg, NiNiPPdAu, NiNiPAu, NiNiPPd, NiNiPAuAg, NiNiPPdAuAg.

Chip 104 may include a gate region contact 126 and at least one first source/drain region contact 128 formed over, e.g. directly on or indirectly on, top side 122, and at least one second source/drain region contact 132 formed over bottom side 124. Each of the contacts may include an electrically conductive contact pad. Each of the contacts may be electrically isolated from each other over top side 122 of chip 104. For example, gate region contact 126 may be electrically isolated from at least one first source/drain region contact 128 by an electrically insulating material, e.g. silicon dioxide, formed over top side 122. Encapsulation materials, e.g. electrically insulating material 108 described hereinafter, may also be used to electrically isolate gate region contact 126 from at least one first source/drain region contact 128.

Chip 104 may be electrically connected to chip carrier 102 via at least one contact pad, e.g. second source/drain region 132 formed over a chip bottom side 124.

Chip 104 may be electrically connected to chip carrier 102 via an electrically conductive medium 134, the electrically conductive medium including at least one from the following group of materials, the group consisting of: a solder, a soft solder, a diffusion solder, an electrically conductive paste, a nanopaste, an adhesive, an electrically conductive adhesive.

In 120, following adhesion of chip 104 to chip carrier 102, electrically insulating material 108 may be deposited over chip 104. Electrically insulating material 108 may be deposited wherein it covers chip top side 122, and/or one or more sidewalls of chip 104, wherein the one or more sidewalls may be walls of chip 104 extending between chip top side 122 and chip bottom side 124. Electrically insulating material 108 may further cover chip carrier top side 106.

Electrically insulating material 108 may also be referred to as "mold material" and/or "encapsulation material".

Electrically insulating material 108 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles. Electrically insulating material 108 may have a thickness $t_e$ ranging from about 1 µm to about 1000 µm, e.g. from 5 to 100 µm.

In 130, one or more electrical interconnects 136 may be formed through electrically insulating material 108, and may provide an electrically conductive contacting path to one or more electrically conductive contact regions 126,128, i.e. one or more contact pads formed over chip top side 122. One or more through-holes, e.g. through-hole vias, may be formed in electrically insulating material 108 releasing one or more electrically conductive contact regions 126, 128 from electrically insulating material 108.

For example, a first through-hole via may be formed in electrically insulating material 108 releasing gate contact region 126 from electrically insulating material 108. Another through-hole via may be formed in electrically insulating material 108 releasing first source/drain region 128 from electrically insulating material 108. The through-holes may be formed substantially perpendicular to chip top side 122.

The through-holes may be filled with electrically conductive material, the electrically conductive material forming the one or more electrically interconnects 136. Each through hole may be formed substantially over a contact region of chip 104 to which the one or more electrical interconnects 136 may be electrically connected.

One or more electrical interconnects 136 formed through electrically insulating material 108 may be configured to electrically connect one or more contact pads 126, 128 formed over chip top side 122 to one or more electrically conductive contact regions 112. One or more electrically conductive contact regions may include regions 138, 142 which may include electrically conductive material deposited during the deposition of one or more electrical interconnects 136. One or more electrically conductive contact regions 138,142 may be formed over electrically insulating material 108. One or more electrically conductive contact regions 138, 142 may be referred to as a redistribution layer, and may be connected to solder material, e.g. solder bumps, in subsequent processes.

In 140, further electrically insulating material 114 may be disposed over chip carrier bottom side 116. Further electrically insulating material 114 may be selectively deposited over and/or selectively removed from chip carrier bottom side 116, such that at least a part of chip carrier bottom side 116 may not be covered by further electrically insulating material 114. For example, electrically conductive contact region 118 on chip carrier bottom side 116 may be released from further electrically insulating material 114. Electrically conductive contact region 118 may therefore provide an electrically conductive path to chip bottom side 124, e.g. to second source/drain region contact 132.

Further electrically insulating material 114 may include an electrically insulating material including at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles. Further electrically insulating material 114 may have a thickness $t_f$ ranging from about 1 μm to about 1000 μm, e.g. from 5 to 100 μm.

Layer 143 may be deposited over chip top side 122, and over one or more electrically conductive contact regions 112. Layer 143 may include an electrically insulating material including at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles. A portion of layer 143 may be selectively released from one or more electrically conductive contact regions 112, e.g. regions 138, 142. In other words, layer 143 may cover chip package top side 152 except for one or more electrically conductive contact regions 112 which may be exposed.

In 150, one or more joining structures 144, 146 and further joining structure 148 may be deposited to be electrically connected to the electrically conductive contact regions 112. One or more joining structures 144, 146 may include at least one from the following group of structures, the group consisting of: a solder ball, a solder bump. Further joining structure 148 may include at least one from the following group of structures, the group consisting of: a solder ball, a solder bump.

One or more joining structures 144, 146 may include at least one from the following group of materials, the group consisting of: a solder, a soft solder, a diffusion solder, an electrically conductive paste, a nanopaste. Further joining structure 148 may include at least one from the following group of materials, the group consisting of: a solder, a soft solder, a diffusion solder, an electrically conductive paste, a nanopaste.

One or more joining structures 144, 146 may be electrically connected to the one or more electrically conductive contact regions 138, 142 formed over chip package top side 152. Further joining structure 148 may be formed on defined electrically conductive contact region 118 on chip carrier bottom side 116, wherein defined electrically conductive contact region 118 of chip carrier 102 may not be covered by further electrically insulating material 114 (over chip bottom side 154).

Further joining structure 148 may be electrically connected to at least one contact pad 132, e.g. second source/drain region 132 formed over chip bottom side 124.

Figure 1E:
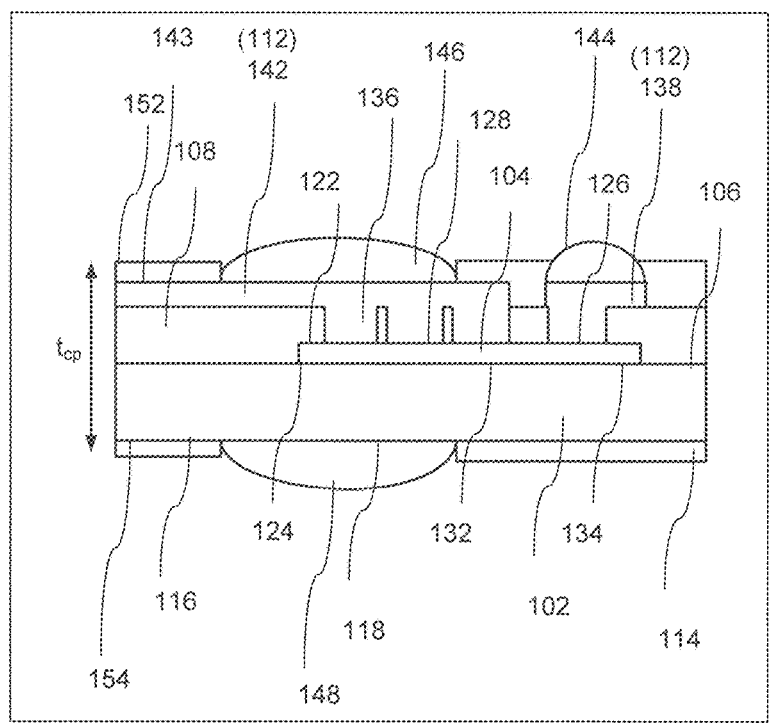

A chip package such as chip package 160 as shown in FIG. 1E may be manufactured according to a method described according to method 100.

Figure 2:
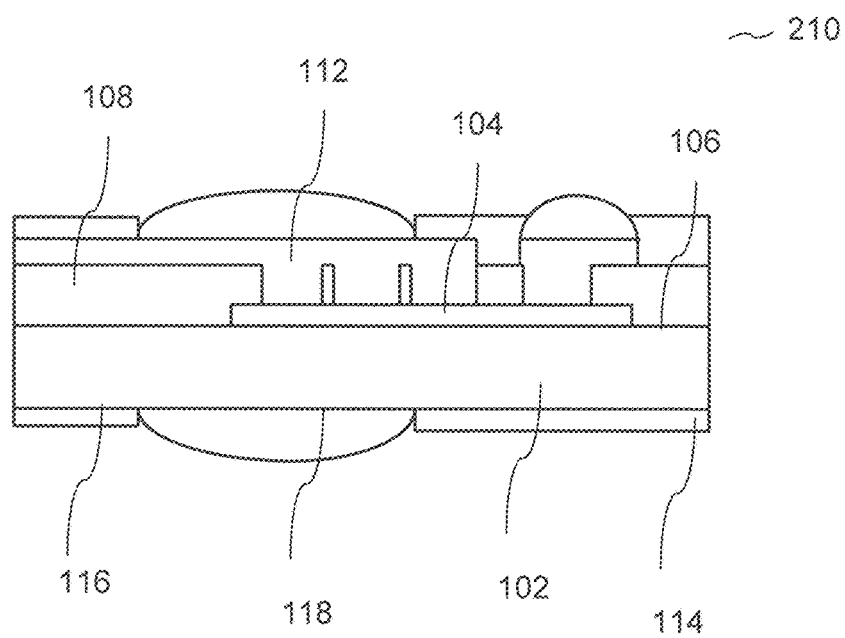
FIG. 2 shows a chip package according to an embodiment.

FIG. 2 shows chip package 210 according to embodiment. Chip package 210 may include: chip carrier 102; chip 104 disposed over and electrically connected to chip carrier top side 106; electrically insulating material 108 disposed over and at least partially surrounding chip 104; one or more electrically conductive contact regions 112 formed over electrically insulating material 108 and in electrical connection with chip 104; further electrically insulating material 114 disposed over chip carrier bottom side 116; wherein electrically conductive contact region 118 on chip carrier bottom side 116 may be released from further electrically insulating material 114.

According to various embodiments, chip package 210 may further include one or more or all of the features of chip package 160 already described with respect to the formation of chip package 160 in method 100.

Figure 4:
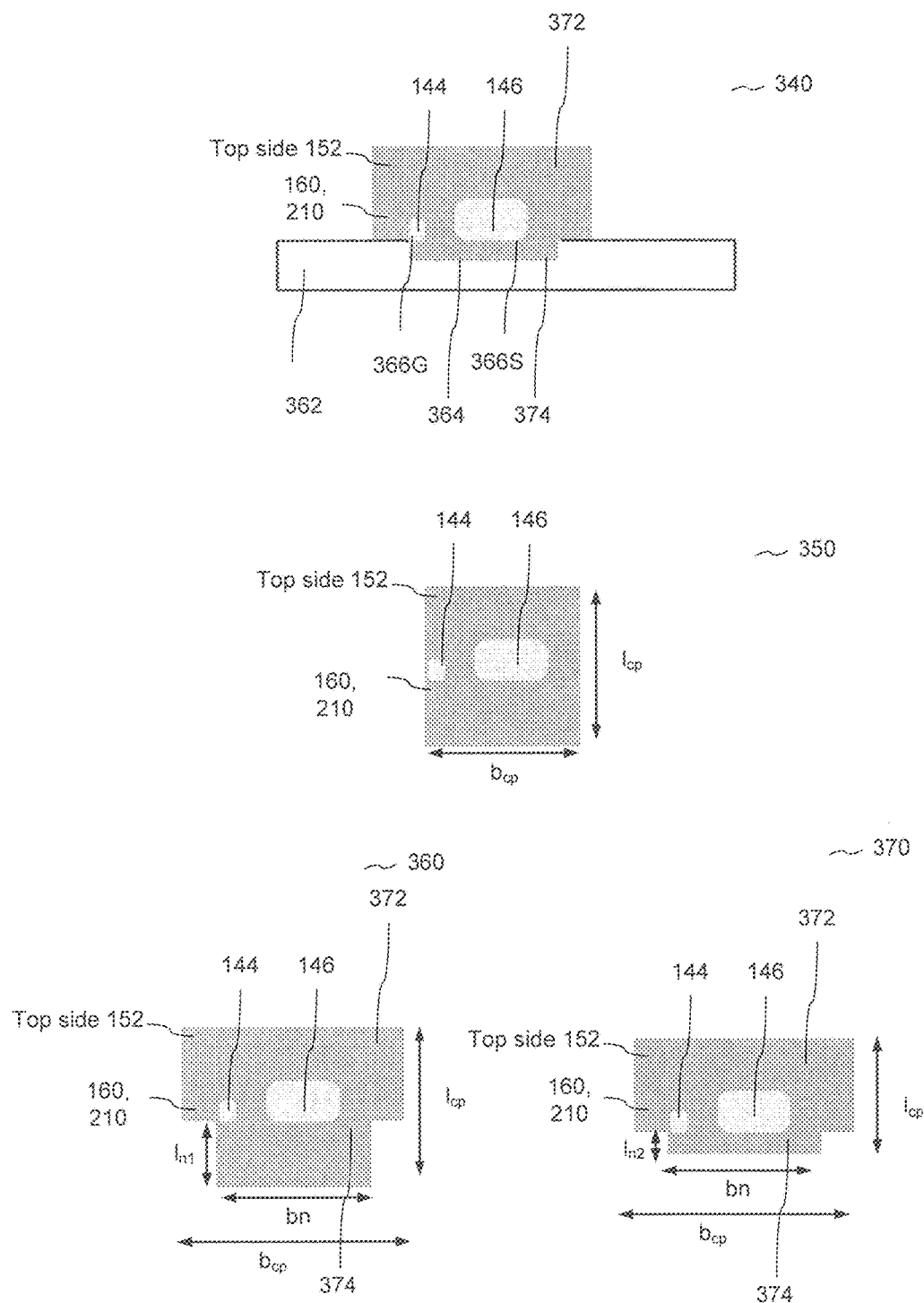
FIG. 4 shows a side view and a top view of a chip package.

It may be understood that a chip package according to an embodiment, e.g. chip package 160, e.g. chip package 210, wherein electrically conductive contact region 118 may be formed on chip carrier bottom side 116 and released from further electrically insulating material 114, may reduce the size of the chip package, in comparison with a chip package 410 (as shown in FIG. 4), wherein a bottom side to top side electrical interconnect 456 may be required. The latter chip package 410 may further require an additional contact region 458 formed over the front side 106 of the chip carrier which is electrically connected to chip bottom side 124, thereby increasing the size of the chip package, as shown in the side view and top view of chip package 410 in FIG. 4. Furthermore, the additional contact region 458 must be arranged minimally at a sufficient creepage distance far enough from a neighboring contact, e.g. gate contact and/or source contact, due to the high voltages of the power semiconductor. The creepage distance may be defined as a shortest distance on the surface of an insulating material between two electrically conductive contact, e.g. between additional contact region 458 and neighboring contact. Due to a need to preserve the minimum creepage distance, the latter chip package 410 may have an increased length $L_2$ compared to length $L_1$ of chip package 160, 210. For example, typical creepage length for a 600 V device may be approximately 3 mm, including the contact pad size. The length $L_2$ of the conventional package (e.g. package 410) may therefore be approximately 4 mm to meet the 3 mm creepage length requirement. With chip package 160, 210, the creepage length may be the "thickness of the package", which may for example, be approximately 0.5 mm. The thickness of the package 0.5 mm may remain the same, even for higher voltage devices, e.g. 1200 V devices, which may have a required creepage distance of approximately 8 mm. A conventional package, e.g. package 410, would have to be extended accordingly, i.e. $L_2$ would have to be increased for example, to more than 8 mm, to ensure that the creepage distance requirement e.g. of 8 mm, may be met.

As shown from a top view of the latter chip package 410, all contacts e.g. gate contact source contact and drain contact may be formed on the same side of the chip package, and therefore a surface mount package may be created.

In addition to reducing the size of the chip package, it may further be possible to overcome the challenge of maintaining sufficient minimal creepage distance between neighboring contacts without increasing the size of the chip packages 160, 210 as a result of the second source/drain contact 118 being arranged on an opposite side 116 of chip carrier 102 from the first source/drain contact 128 and/or the gate contact 126.

Instead of connecting chip package, e.g. chip package 160, e.g. chip package 210 to a conventional circuit board, using a standard surface mounting technique, chip package 160, 210 may be stacked partially and or fully through the circuit board, according to various embodiments. The distance between two contacts, e.g. first source/drain contact 128 and second source/drain contact 118 may then at least be as large as the thickness of the chip package $t_{cp}$, and may therefore fulfill the minimum creepage distance, without extending the length of the chip package.

It may be understood that a chip package, e.g. chip package 160, e.g. chip package 210 according to an embodiment, may include: chip carrier 102; chip 104 disposed over and electrically connected to chip carrier first side 106; electrically insulating material 108 disposed over chip first side 106 and at least partially surrounding chip 104; one or more electrically conductive contact portions 112 formed over electrically insulating material 108 and in electrical connection with one or more chip pads 126, 128 formed on chip first side 106; further electrically insulating material 114 disposed over chip carrier second side 116, wherein chip carrier second side 116 faces a direction opposite to the direction which chip carrier first side 106 faces; and wherein an electrically conductive contact region 118 on chip carrier second side 116 is released from further electrically insulating material 114.

Figure 3:
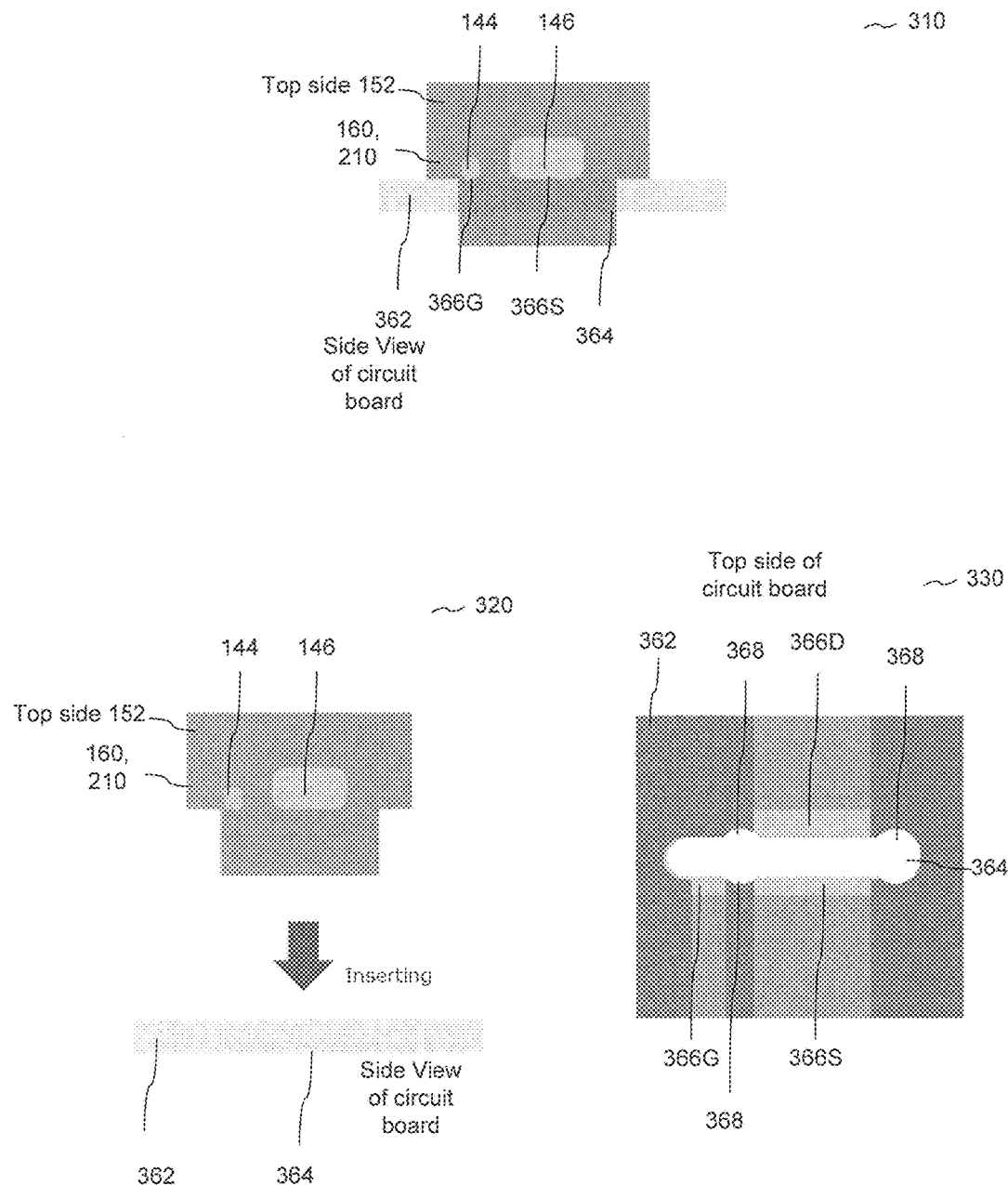
FIG. 3A shows a chip arrangement according to an embodiment.
FIG. 3B show chip arrangements according to various embodiment.

FIG. 3A shows chip arrangement 310 according to an embodiment. Chip arrangement 310 may include: circuit board 362 and a chip package, e.g. chip package 160, 210. As shown in 310 and 330, circuit board 362 may include: a through-hole 364 formed in circuit board 362; and one or more circuit board contact regions $366_S$, $366_G$, $366_D$ arranged proximate to through-hole 364. One or more circuit board contact regions $366_S$, $366_G$ may be deposited, e.g. using plating, e.g. electroplating, e.g. sputtering, e.g. evaporation. Chip arrangement 310 may include chip package, e.g. chip package 160, e.g. chip package 210, arranged within through-hole 364. As shown in 320, chip package, e.g. chip package 160, e.g. chip package 210, may be inserted fully and/or partially into circuit board 362. At least one circuit board contact region, e.g. $366_S$, $366_G$, may be electrically connected, e.g. soldered, to one or more electrically conductive contact regions 144, 146 formed over top side 152 of a chip package e.g. chip package 160, e.g. chip package 210, and in electrical connection with chip top side 122; and wherein at least one further circuit board contact region $366_D$ may be electrically connected, e.g. soldered, to a electrically conductive contact region 148 formed over bottom side 154 of the chip package, e.g. chip package 160, e.g. chip package 210, and in electrical connection with chip bottom side 124.

Chip package 160, 210 may further include chip 104 disposed over and electrically connected to a chip carrier top side 106; electrically insulating material 108 disposed over and at least partially surrounding chip 104, wherein one or more electrically conductive contact regions 112 may be formed through electrically insulating material 108; and further electrically insulating material 114 disposed over chip carrier bottom side 116 wherein electrically conductive contact region 118 on chip carrier bottom side 116 may be released from further electrically insulating material 114.

One or more circuit board contact regions $366_S$, $366_G$, $366_D$ may be arranged at edges of through-hole 364. Chip package 160, 210 may be arranged within through-hole 364 such that chip top side 122 and chip bottom side 124 may each face opposite edges of the through-hole 364.

According to various embodiments, circuit board 362 may include: through-hole 364 formed in circuit board 362 for receiving chip package 160, 210; and one or more circuit board contact regions $366_S$, $366_G$, $366_D$ arranged proximate to through-hole 364; wherein at least one circuit board contact region, e.g. $366_S$, $366_G$, may be electrically connected to one or more electrically conductive contact regions 144, 146 formed over top side 152 of chip package 160, 210 and in electrical connection with chip top side 122; and wherein at least one further circuit board contact region $366_D$ may be electrically connected to a electrically conductive contact region 148 formed over bottom side 154 of chip package 160, 210 and in electrical connection with chip bottom side 124.

At least one circuit board contact region $366_S$, $366_G$, and at least one further circuit board contact region $366_D$ may be arranged at substantially opposite edges of through-hole 364; and at least one circuit board contact region $366_S$, $366_G$ may be configured to face a chip package top side 152; and the at least one further circuit board contact region $366_D$ may be configured to face a chip package bottom side 154.

Circuit board 362 may include at least one from the following group of materials, the group consisting of: epoxy, thermoset material, glass-reinforced epoxy, laminate, epoxy resin. Circuit board 362 may include for example FR4 material.

Each of one or more circuit board contact regions $366_S$, $366_G$, $366_D$ may be separated, e.g. electrically insulated from each other by circuit board 362 material i.e. an electrically insulating material. According to various embodiments, drilling partially and/or fully through circuit board 362 may be used to create regions 368, which electrically isolate one or more circuit board contact regions $366_S$, $366_G$, $366_D$ regions from each other.

It may be understood that although only three contact regions, e.g. gate, first source/drain region and second source/drain region have been described, embodiments may not be limited to having three contact regions only, and may include any number of contact regions, i.e. pins, made possible by lithographic methods, e.g. 3, 4, 5, 6, 7 or more contact regions. Furthermore, different types of pins may no longer be required.

Various embodiments may further provide chip arrangement 340 as shown in FIG. 3B. Chip arrangement 340 may include: circuit board 362 including: cavity 364 formed in circuit board 362; and one or more circuit board contact regions $366_S$, $366_G$, $366_D$ arranged proximate to cavity 364. Chip arrangement 340 may include chip package, e.g. chip package 160, e.g. chip package 210, arranged within cavity 364, wherein at least one circuit board contact region, e.g. $366_S$, $366_G$, may be electrically connected to one or more electrically conductive contact regions 144, 146 formed over top side 152 of chip package 160, 210 and in electrical connection with chip top side 122; and wherein at least one further circuit board contact region $366_D$ may be electrically connected to a electrically conductive contact region 148 formed over bottom side 154 of chip package 160, 210 and in electrical connection with chip bottom side 124.

As can be seen from chip arrangement 340, it may be possible that cavity 364 may not include a fully formed through-hole through circuit board 362. Instead, cavity 364 may include a depression within circuit board 362, wherein at least a portion of chip package 160, 210 may be arranged with the depression, i.e. within cavity 364.

At least one circuit board contact region $366_S$, $366_G$, and at least one further circuit board contact region $366_D$ may be arranged at substantially opposite edges of cavity 364; and at least one circuit board contact region $366_S$, $366_G$ may be configured to face a chip package top side 152; and the at least one further circuit board contact region $366_D$ may be configured to face a chip package bottom side 154.

It may be understood, that as shown in 320, chip package, e.g. chip package 160, e.g. chip package 210, may be inserted fully and/or partially into circuit board 362. Chip package 160, 210 may therefore be configured according to various embodiments. According to an embodiment as shown in 350, chip package 160, 210 may include a substantially rectangular three-dimensional chip package, including a length $l_{cp}$, breadth $b_{cp}$, and a thickness $t_{cp}$ (in a direction into the paper). Area defined by length $l_{cp}$×breadth $b_{cp}$ may define the surface area of the top side 152 of chip package 160, 210.

Chip package length $l_{cp}$ may range from about 1 mm to about 30 mm.

Chip package breadth $b_{cp}$ may range from about 1 mm to about 50 mm.

Chip package thickness $t_{cp}$ may range from about 100 µm to about 3000 µm.

According to an embodiment as shown in 360 and 370, chip package 160, 210 may include widened portion 372 and a narrowed portion 374.

For example, widened portion 372 may have a breadth $b_{cp}$, e.g. the breadth of the chip package, and narrowed portion 374 may have a breadth $b_n$ which may be smaller than breadth $b_{cp}$. For examples, narrowed portion 374 may have a breadth $b_n$ ranging from about 1 mm to about 50 mm.

Widened portion 372 and narrowed portion 374 may each include at least part of electrically insulating material 108 and/or further electrically insulating material 114 and/or layer 143 and/or chip 104 and/or chip carrier 102. Widened portion 372 and narrowed portion 374 may each be electrically insulating portions of the chip package.

Widened portion 372 and narrowed portion 374 may stabilize chip package 160, 210 with respect to circuit board 362. For example, narrowed portion 374 may be inserted into partially or fully into through-hole 364 or cavity 364. Widened portion 372 may be a portion of chip package which remains outside the through-hole 364 or cavity 364. Widened portion 372 may be supported by circuit board 362, wherein widened portion 372 may be disposed over circuit board 362, wherein widened portion 372 stabilizes chip package 160, 210 on circuit board 362.

As shown in 360 and 370, narrowed portion 374 may also have different lengths. For example, if narrowed portion 374 is to be fully inserted into through-hole 364, then narrowed portion may have a length $l_{n1}$ ranging from about 200 µm to about 3000 µm. If narrowed portion 374 is to be only partially inserted into cavity 364, then narrowed portion may have a length $l_{n2}$ ranging from about 20 µm to about 500 µm, wherein $l_{n2}$ may be smaller than $l_{n1}$.

Figure 5:
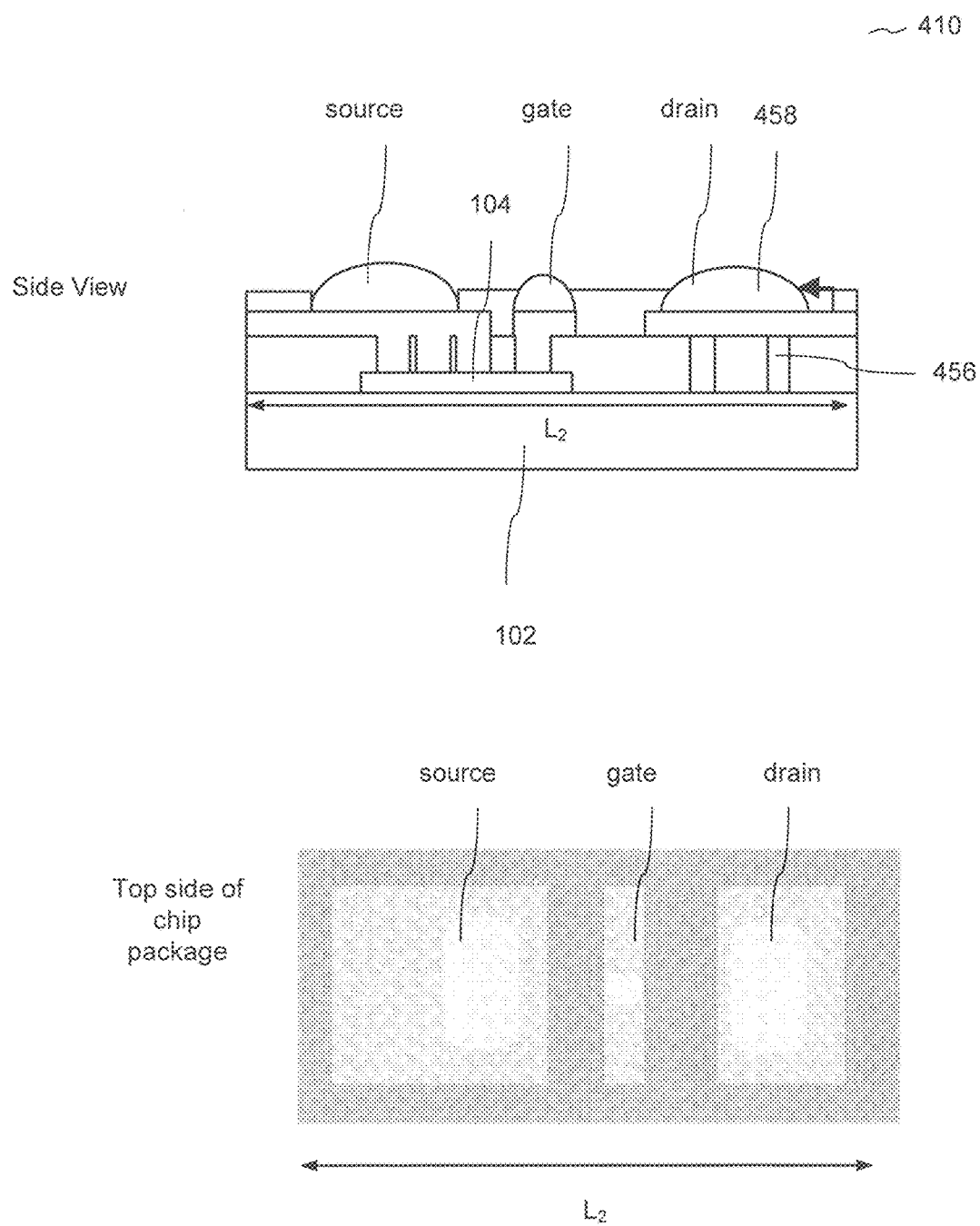
FIG. 5 shows a method for manufacturing a chip package according to an embodiment.

FIG. 5 shows method 500 for manufacturing a chip package according to an embodiment. Method 500 may include:

disposing a chip over a chip carrier top side and electrically connecting the chip to the chip carrier top side (in 510);

disposing an electrically insulating material over the chip wherein the electrically insulating material at least partially surrounds the chip (in 520);

forming one or more electrically conductive contact regions over the electrically insulating material wherein the one or more electrically conductive contact regions is electrically connected with the chip (in 530);

disposing a further electrically insulating material over a chip carrier bottom side (in 540); and releasing an electrically conductive contact region on the chip carrier bottom side from the further electrically insulating material (in 550).

Figure 6:
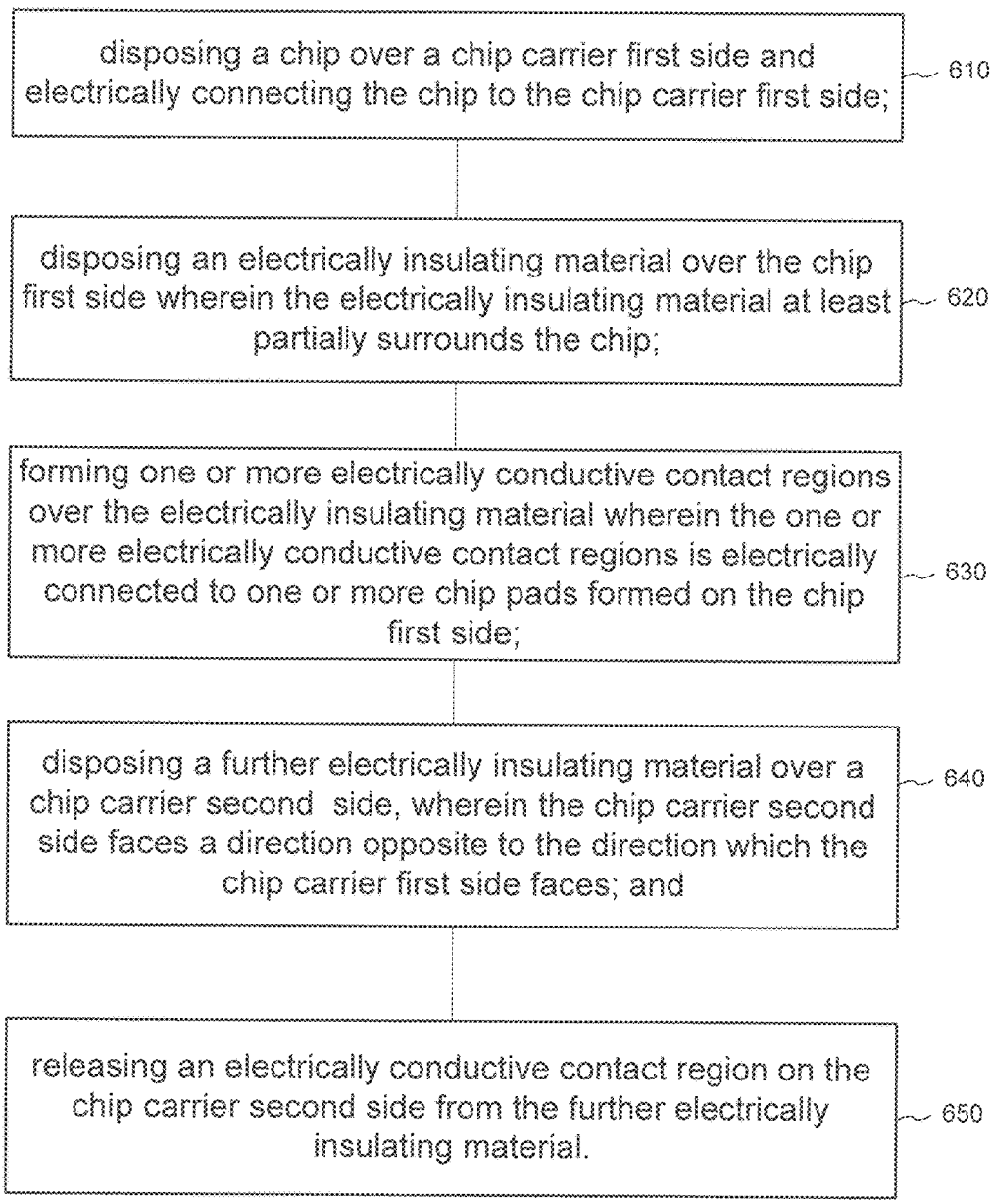
FIG. 6 shows a method for manufacturing chip package according to an embodiment.

FIG. 6 shows method 600 for manufacturing a chip package according to an embodiment. Method 600 may include:

disposing a chip over a chip carrier first side and electrically connecting the chip to the chip carrier first side (in 610);

disposing an electrically insulating material over the chip first side wherein the electrically insulating material at least partially surrounds the chip (in 620);

forming one or more electrically conductive contact regions over the electrically insulating material wherein the one or more electrically conductive contact regions is electrically connected to one or more chip pads formed on the chip first side (in 630); and disposing a further electrically insulating material over a chip carrier second side, wherein the chip carrier second side faces a direction opposite to the direction which the chip carrier first side faces (in 640);

and releasing an electrically conductive contact region on the chip carrier second side from the further electrically insulating material (in 650).

Various embodiments provide a method for modifying a layout of embedded components which makes a through-hole technology THT montage possible.

Various embodiments provide a method through layered layout design, wherein electronic components based on chip embedded technology, may be manufactured in a through-hole arrangement.

Various embodiments provide a chip package arrangement which places less spatial demands on a circuit board, e.g. a PCB.

Various embodiments provide a chip package arrangement wherein isolation distances through the vertically inserted electronic board material, clearly reduces space demands in high voltage components.

Various embodiments provide a chip package arrangement wherein electronic components with vertical current flow require lower packaging consumption.

Various embodiments provide a chip package including: a chip carrier; a chip disposed over and electrically connected to a chip carrier top side; an electrically insulating material disposed over and at least partially surrounding the chip; one or more electrically conductive contact regions formed over the electrically insulating material and in electrical connection with the chip; a further electrically insulating material disposed over a chip carrier bottom side; wherein an electrically conductive contact region on the chip carrier bottom side is released from the further electrically insulating material.

According to an embodiment, the chip carrier includes a lead frame carrier.

According to an embodiment, the chip carrier includes an electrically conductive material, the electrically conductive material including at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

According to an embodiment, the chip is configured to carry a voltage ranging from about 5 V to about 1200 V.

According to an embodiment, the chip includes at least one device from the following group of devices, the group consisting of: a transistor, a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device, a multi-chip device.

According to an embodiment, the chip is electrically connected to the chip carrier via at least one contact pad formed over a chip bottom side.

According to an embodiment, the chip is electrically connected to the chip carrier via an electrically conductive medium, the electrically conductive medium including at least one from the following group of materials, the group consisting of: a solder, a soft solder, a diffusion solder, an electrically conductive paste, a nanopaste, an adhesive, an electrically conductive adhesive.

According to an embodiment, the electrically insulating material includes at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

According to an embodiment, the chip package further includes one or more electrical interconnects formed through the electrically insulating material; wherein the one or more electrical interconnects are configured to electrically connect one or more contact pads formed over a chip top side to the one or more electrically conductive contact regions.

According to an embodiment, the chip package further includes one or more joining structures electrically connected to the one or more electrically conductive contact regions.

According to an embodiment, the one or more joining structures includes at least one from the following group of materials, the group consisting of: a solder, a soft solder, a diffusion solder, an electrically conductive paste, a nanopaste.

According to an embodiment, the one or more joining structures includes at least one from the following group of structures, the group consisting of: a solder ball, a solder bump, a pillar, a copper pillar.

According to an embodiment, the chip package further includes a further joining structure formed on the defined electrically conductive contact region on the chip carrier bottom side; wherein the defined electrically conductive contact region of the chip carrier is not covered by the further electrically insulating material.

According to an embodiment, the chip package further includes a further joining structure formed on the defined electrically conductive contact region on the chip carrier bottom side; wherein the further joining structure is electrically connected to at least one contact pad formed over a chip bottom side.

According to an embodiment, the further joining structure includes at least one from the following group of materials, the group consisting of: a solder, a soft solder, a diffusion solder, an electrically conductive paste, a nanopaste.

According to an embodiment, the further joining structure includes at least one from the following group of structures, the group consisting of: a solder ball, a solder bump, a pillar, a copper pillar.

Various embodiments provide a chip arrangement including: a circuit board including: a through-hole formed in the circuit board; and one or more circuit board contact regions arranged proximate to the through-hole; a chip package arranged within the through-hole, wherein at least one circuit board contact region is electrically connected to the one or more electrically conductive contact regions formed over a top side of the chip package and in electrical connection with a chip top side; and wherein at least one further circuit board contact region is electrically connected to a electrically conductive contact region formed over a bottom side of the chip package and in electrical connection with a chip bottom side.

According to an embodiment, the chip package further includes a chip disposed over and electrically connected to a chip carrier top side; an electrically insulating material disposed over and at least partially surrounding the chip, wherein the one or more electrically conductive contact regions is formed through the electrically insulating material; and a further electrically insulating material disposed over a chip carrier bottom side wherein the electrically conductive contact region on the chip carrier bottom side is released from the further electrically insulating material.

According to an embodiment, the one or more circuit board contact regions are arranged at edges of the through-hole; and the chip package is arranged within the through-hole such that the chip top side and the chip bottom side each face opposite edges of the through-hole.

Various embodiments provide a circuit board including: a through-hole formed in the circuit board for receiving a chip package; and one or more circuit board contact regions arranged proximate to the through-hole; wherein at least one circuit board contact region is configured to be in electrical connection with one or more electrically conductive contact regions formed over a chip package top side and in electrical connection with a chip top side; and wherein at least one further circuit board contact region is configured to be in electrical connection with an electrically conductive contact region formed over a chip package bottom side and in electrical connection with a chip bottom side.

According to an embodiment, the at least one circuit board contact region and the at least one further circuit board contact region are arranged at substantially opposite edges of the through-hole; and the at least one circuit board contact region is configured to face a chip package top side; and the at least one further circuit board contact region is configured to face a chip package bottom side.

Various embodiments provide a chip package including: a chip carrier; a chip disposed over and electrically connected to a chip carrier first side; an electrically insulating material disposed over a chip first side and at least partially surrounding the chip; one or more electrically conductive contact portions formed over the electrically insulating material and in electrical connection with one or more chip pads formed on a chip first side; a further electrically insulating material disposed over a chip carrier second side, wherein the chip carrier second side faces a direction opposite to the direction which the chip carrier first side faces; and wherein an electrically conductive contact region on the chip carrier second side is released from the further electrically insulating material.

Various embodiments provide a method for manufacturing a chip package, the method including: disposing a chip over a chip carrier top side and electrically connecting the chip to the chip carrier top side; disposing an electrically insulating material over the chip wherein the electrically insulating material at least partially surrounds the chip; forming one or more electrically conductive contact regions over the electrically insulating material wherein the one or more electrically conductive contact regions is electrically connected with the chip; disposing a further electrically insulating material over a chip carrier bottom side; and releasing an electrically conductive contact region on the chip carrier bottom side from the further electrically insulating material.

Various embodiments provide a method for manufacturing a chip package, the method including: disposing a chip over a chip carrier first side and electrically connecting the chip to the chip carrier first side; disposing an electrically insulating material over the chip first side wherein the electrically insulating material at least partially surrounds the chip; forming one or more electrically conductive contact regions over the electrically insulating material wherein the one or more electrically conductive contact regions is electrically connected to one or more chip pads formed on the chip first side; disposing a further electrically insulating material over a chip carrier second side, wherein the chip carrier second side faces a direction opposite to the direction which the chip carrier first side faces; and releasing an electrically conductive contact region on the chip carrier second side from the further electrically insulating material.

Various embodiments provide a chip arrangement including: a circuit board including: a cavity formed in the circuit board; and one or more circuit board contact regions arranged proximate to the cavity; a chip package arranged within the cavity, wherein at least one circuit board contact region is electrically connected to the one or more electrically conductive contact regions formed over a top side of the chip package and in electrical connection with a chip top side; and wherein at least one further circuit board contact region is electrically connected to a electrically conductive contact region formed over a bottom side of the chip package and in electrical connection with a chip bottom side.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement comprising:
    a circuit board comprising:
        a cavity formed in the circuit board;
        and one or more circuit board contact regions arranged proximate to the cavity;
    a chip package arranged within the cavity,
    wherein at least one circuit board contact region is electrically connected to the one or more electrically conductive contact regions formed over a top side of the chip package and in electrical connection with a chip top side; and
    wherein at least one further circuit board contact region is electrically connected to an electrically conductive contact region formed over a bottom side of the chip package and in electrical connection with a chip bottom side;
    a chip disposed over and electrically connected to a chip carrier top side; and
    a further electrically insulating material disposed under a chip carrier bottom side wherein an electrically conductive contact region over the chip carrier bottom side is formed through the electrically insulating material.

2. The chip arrangement according to claim 1, wherein the chip package further comprises:
    an electrically insulating material disposed over and at least partially surrounding the chip, wherein the one or more electrically conductive contact regions over the chip carrier top side comprises two or more electrically conductive contact regions formed through the electrically insulating material.

3. The chip arrangement according to claim 1, wherein the chip package comprises:
    wherein the further electrically insulating material disposed under a chip carrier bottom side at least partially spans the chip carrier bottom side, and wherein at least one electrically conductive contact region on the chip carrier bottom side is released from the further electrically insulating material.

4. The chip arrangement according to claim 1, wherein the one or more circuit board contact regions are arranged at edges of the cavity; and
    wherein the chip package is arranged within the cavity such that the chip top side and the chip bottom side each face opposite edges of the cavity.

5. The chip arrangement according to claim 1, wherein chip package is fully or partially inserted into the cavity of the circuit board.

6. The chip arrangement according to claim 1, wherein the chip package is arranged within the cavity to where the chip top side and the chip bottom side each face opposite edges of the cavity of the circuit board.

7. The chip arrangement according to claim 1, wherein each of the one or more circuit board contact regions are electrically insulated from each other.

8. The chip arrangement according to claim 1, wherein the cavity is a depression within the circuit board, and the chip package is arranged within the depression.

9. The chip arrangement according to claim 1, wherein the chip package comprises a widened portion and a narrowed portion.

10. The chip arrangement according to claim 9, wherein the widened portion is supported by the circuit board and remains outside of the cavity.

11. A chip arrangement comprising:
    a circuit board comprising:
        a cavity formed in the circuit board;

and one or more circuit board contact regions arranged proximate to the cavity;
a chip package arranged within the cavity, wherein the chip package comprises a widened portion and a narrowed portion;
wherein at least one circuit board contact region is electrically connected to the one or more electrically conductive contact regions formed over a top side of the chip package and in electrical connection with a chip top side; and
wherein at least one further circuit board contact region is electrically connected to an electrically conductive contact region formed over a bottom side of the chip package and in electrical connection with a chip bottom side.

12. The chip arrangement according to claim 11, wherein the widened portion is supported by the circuit board and remains outside of the cavity.

13. The chip arrangement according to claim 11, wherein the cavity is a depression within the circuit board, and the chip package is arranged within the depression.

* * * * *